Dec. 20, 1960 J. R. MACDONALD 2,965,853

AUGMENTED CATHODE FOLLOWER

Filed Sept. 3, 1957 5 Sheets-Sheet 1

INVENTOR
James Ross Macdonald
BY
Stevens, Davis, Miller & Mosher
ATTORNEYS

Dec. 20, 1960

J. R. MACDONALD 2,965,853

AUGMENTED CATHODE FOLLOWER

Filed Sept. 3, 1957

5 Sheets-Sheet 2

INVENTOR
James Ross Macdonald

BY Stevens, Davis, Miller & Mosher
ATTORNEYS

INVENTOR
James Ross Macdonald
BY
Stevens, Davis, Miller & Mosher
ATTORNEYS

INVENTOR
James Ross Macdonald

BY Stevens, Davis, Miller & Mosher
ATTORNEYS

AUGMENTED CATHODE FOLLOWER

Filed Sept. 3, 1957 5 Sheets-Sheet 5

INVENTOR
James Ross Macdonald

BY Stevens, Davis, Miller & Mosher
ATTORNEYS

United States Patent Office 2,965,853
Patented Dec. 20, 1960

2,965,853

AUGMENTED CATHODE FOLLOWER

James Ross Macdonald, Dallas, Tex., assignor to Texas Instruments Incorporated, Dallas, Tex., a corporation of Delaware Filed Sept. 3, 1957, Ser. No. 681,629
11 Claims. (Cl. 330—91)

The present invention relates to improved cathode follower circuits having very high input impedance, low output impedance, wide dynamic range, extremely low distortion, frequency response from zero to the megacycle/sec. range, and input-output transfer ratios (the ratio of the magnitude of the output voltage to the magnitude of the input voltage) very close to or exceeding unity with no phase reversal.

The circuits according to the present invention are suitable for many applications. They may be used as grid drivers of high-power output tubes and will supply 100 ma. or more of positive grid current in such service. They are suitable as isolation stages or buffers, particularly where their extremely high input impedance characteristics are desirable. Their lack of phase reversal together with transfer ratios equal to or exceeding unity and their vanishingly small distortion as well as wide dynamic range makes them particularly useful in active electronic filters and frequency selective amplifiers.

The circuits disclosed occupy a somewhat intermediate position between ordinary cathode followers and operational amplifiers. An unmodified cathode follower has relatively high input impedance, an unloaded A.C. input-output transfer ratio generally less than 0.98, an appreciable input-output D.C. offset, a fairly wide dynamic range, an output impedance of several hundred ohms, and frequency response up to the megacycle/sec. region. On the other hand, an operational amplifier generally has A.C. and D.C. voltage amplification very close to or greater than unity, very low non-linear distortion, an output impedance of a few ohms or less, and a frequency response ranging from a few to a few hundred kilocycles/sec.

The invention achieves these desirable features by providing a constant current device in the cathode circuit of a cathode follower connected tube, feeding the output from the cathode of the cathode follower through an amplifier circuit having a high degree of negative feedback, and driving the plate of the cathode follower with a signal, which almost precisely follows the input signal, taken from the feedback amplification circuit. In the resulting circuit the plate and cathode move up and down with the grid signal so that the cathode follower tube operates almost precisely on the same point of its characteristic. Thus the intermodulation distortion is greatly reduced and the dynamic range increased.

Prior to the present invention it was known to provide a constant current impedance in place of the cathode resistor and drive the plate of the cathode follower with a signal derived from the input signal. The present invention greatly improves over this known technique by driving the plate of the cathode follower with a signal derived from the input and processed through an amplifier with a high degree of negative feedback, the amplifier having a high gain without feedback. This distinction results in a remarkable improvement in the distortion reduction and dynamic range.

The present invention further improves over the prior art amplifiers by providing greater input impedance and virtually no input capacitance.

One of the circuits using only 5 triodes has an input-output voltage transfer ratio of 0.995 or greater with no phase reversal, can supply up to 100 ma. of positive current, has a frequency response essentially flat from zero up into the megacycle/sec. range, can have an input capacitance approaching or equal to zero, exhibits an input resistance greater than $10^{11}$ ohms for input swings of $\pm 100$ volts or more using ordinary unselected receiving tubes, has an output resistance of 3 ohms, will handle a dynamic range of 630 volts peak-to-peak, and shows less than one part in a million total harmonic distortion at 20 volts R.M.S. output and only two parts in $10^5$ distortion at 100 volts R.M.S. output.

The objects and advantages will be better understood with reference to the following figures:

Figure 1 shows one modification of the present invention in block diagram form;

Figures 2 an 3 illustrate the detailed circuitry of a cathode amplifier to which the present invention is particularly applicable;

Figures 1, 6:
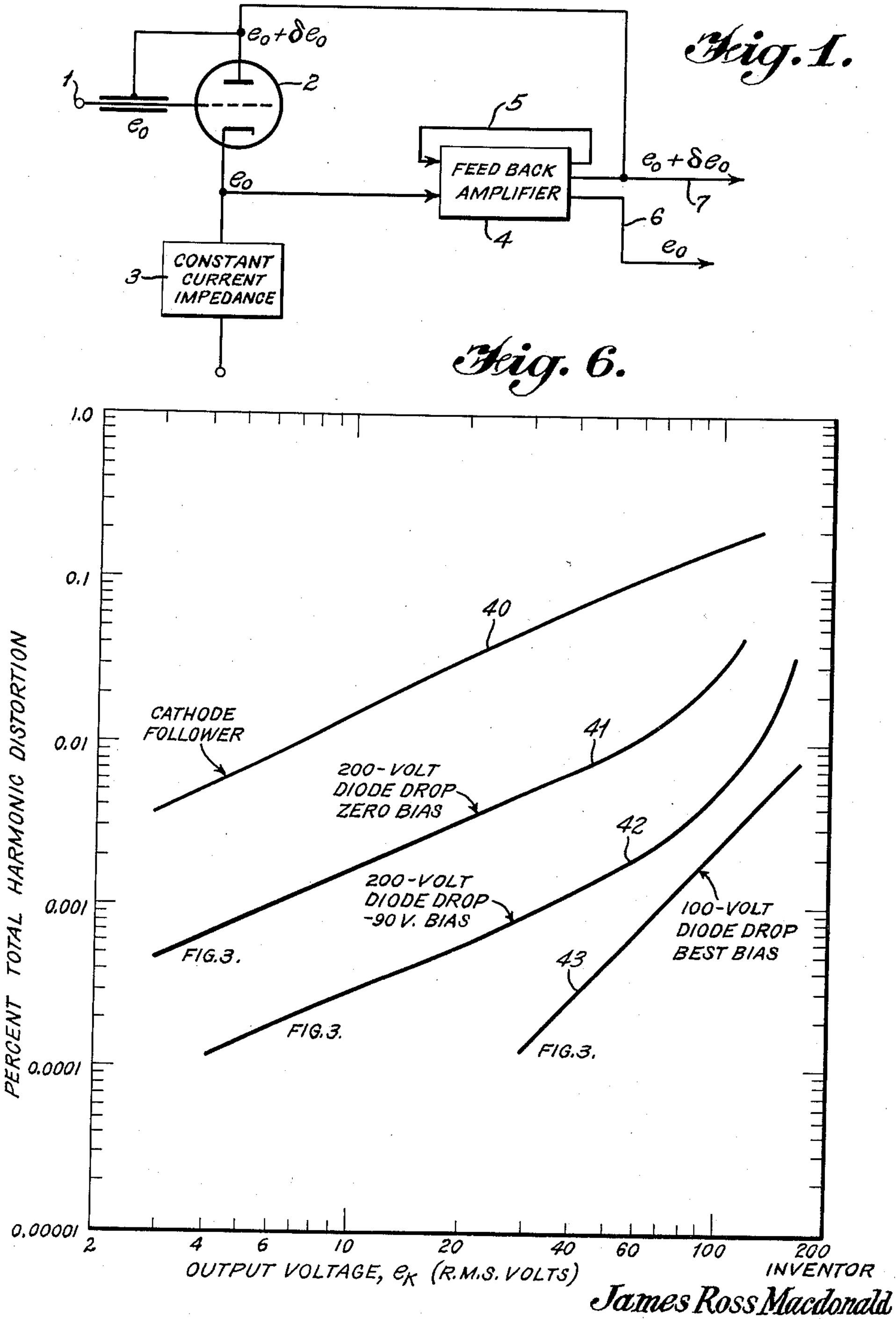
Figures 6, 7 and 8 show curves illustrating the remarkably low harmonic distortion obtained by the present invention.

Referring now to Figure 1 in which one modification of the invention is shown in block diagram form, the signal to be amplified $e_0$ is applied to the terminal 1 which is connected to the grid of a triode 2. A constant current impedance 3 is connected in the cathode circuit of the triode 2. The signal at the cathode of the triode 2 is applied to the feedback amplifier 4. This amplifier 4 has a high gain without feedback. It is adjusted by means of a strong negative feedback over lead 5 to have an input-output gain of only slightly greater than unity. The output from the feedback amplifier is used to drive the plate of the triode 2. The negative feedback is adjusted to select the gain increment exceeding unity, so that the input signal $e_0$ to the triode 2 is reproduced as $e_0$ at the cathode of the triode. The input-ouput gain of the feedback amplifier, represented by K, can be expressed by the following formula:

$$K=\frac{e_0+\delta e_0}{e_0}=1+\frac{\delta e_0}{e_0} \qquad (1)$$

If the constant current impedance in the cathode were truly constant current, $$\frac{\delta e_0}{e_0}$$

could be zero. If desirable, a separate output $e_0$ can be taken out at low impedance from the feedback amplifier on lead 6 as the output, or the output $e_0+\delta e_0$ can be used on lead 7. D.C. levels are not shown but it should be noted that D.C. offset in the amplifier 4 can be so adjusted that the D.C. level of the final output on lead 6 of $e_0$ is exactly equal to the input so that there is no input-output D.C. offset. Thus any signal, D.C. or A.C., at the input is reproduced exactly at the output at a low impedance. Since all the elements of the input tube move up and down together with the input signal, it cannot generate appreciable distortion and the distortion in the output will be exceedingly low. The input capacitances are cancelled by driving the shield around the input signal line from the terminal 1 to the grid of the triode 2 with the $e_0+\delta e_0$ signal. The current through the triode 2 can be adjusted so that its grid floats at ground potential. The input resistance will then exceed $10^{12}$ ohms and will maintain this value independent of input signal level or magitude as long as all the elements of the tube follow the grid. That is, as long as a feedback amplifier output approximates $e_o+\delta e_o$ and $$\frac{\delta e_0}{e_0}\ll 1$$

There has been disclosed in the copending application of James Ross Macdonald, Serial Number 464,335, filed October 25, 1954, in Figure 1, a parallel augmented cathode follower circuit. This circuit shall be designated in this application as the PACF circuit. The PACF circuit is more complex than an ordinary cathode follower and has an output resistance of the order of 5 to 6 ohms and an input-output transfer ratio of the order of 0.97, and can supply up to 200 milliamps. of positive driving current without excessive distortion. The PACF circuit is not an optimum design in terms of number of tubes employed and minimization of D.C. offset. It can be simplified and improved by eliminating the direct signal path to the output and one tube, which in the aforementioned application, is tube $V_1$, can thereby be omitted. The resulting circuit can be designed to supply as much output current as the circuit in the copending application and can be adjusted so that there is no D.C. offset for a given quiescent D.C. input operating level.

Figure 2:
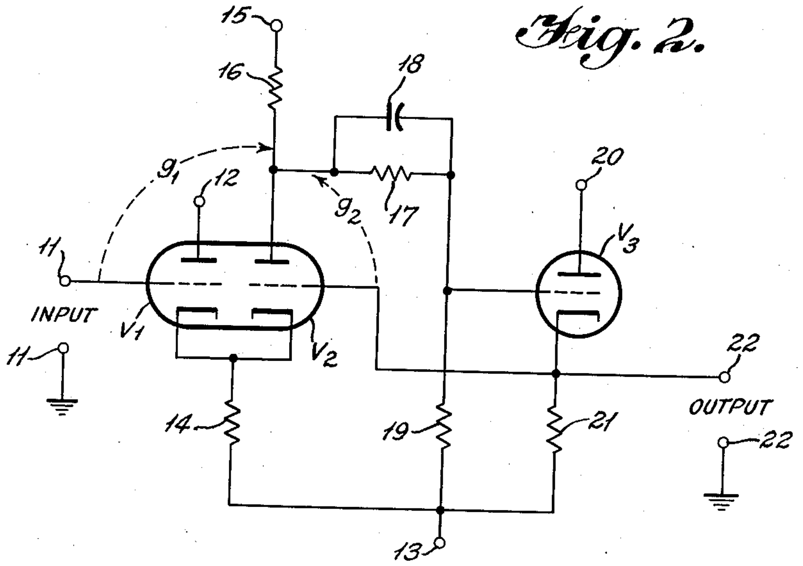

The improved circuit is shown in Figure 2. The input signal is applied to terminals 11, one of which is connected to ground and the other of which is connected to the control grid of a triode $V_1$. The triode $V_1$ is connected as a cathode amplifier with its plate connected to a D.C. power source of 250 volts applied to a terminal 12 and its cathode connected over resistor 14 to another power source of —380 volts applied to a terminal 13. The signal applied to the terminals 11 is transferred to the cathode of the tube $V_1$ with reduced output impedance. A triode $V_2$ has its cathode connected directly to the cathode of the triode $V_1$. The plate of the triode $V_2$ is connected to a 400-volt source of power applied to a terminal 15 over a resistor 16. The plate of the triode $V_2$ is connected to the grid of a triode $V_3$ over the parallel circuit of a resistor 17 and a capacitor 18. The grid of the tube $V_3$ is also connected to the negative D.C. source applied to terminal 13 over the resistor 19. The tube $V_3$ is connected as a cathode amplifier with its plate connected to a 250-volt source applied to the terminal 20 and its cathode connected over resistor 21 to the —330 volts applied to terminal 13.

The signal applied to the grid of the tube $V_3$ is transferred with reduced output impedance to the cathode of the triode $V_3$ and is applied to one of a pair of output terminals 22, the other of which is connected to the ground. The cathode of the triode $V_3$ is also connected directly to the grid of the tube $V_2$. As a result, the signal which will appear on the plate of the triode $V_2$ will be the sum of the signal on the cathode plus the amplified difference between the signal applied to the cathode of the tube $V_2$ and the signal applied to the grid. This amplified difference will be approximately proportional to the input signal applied to the terminal 11 as transferred to the cathode of the triode $V_1$ minus the output signal applied to the terminal 22. The signal on the plate of the triode $V_2$ is applied to the grid of the tube $V_3$ over the parallel circuit of the resistor 17 and the capacitor 18. This parallel circuit together with the resistor 19 constitutes a voltage divider to transfer the signal on the plate of the triode $V_2$ to the grid of the triode $V_3$. The signal is then transferred to the cathode of the triode $V_3$ and from there to the output terminal 22. The resulting output signal on the terminals 22 will closely follow that applied to the input terminals 11 and this output signal can be adjusted by varying the resistors 16 and 14 so that there is no D.C. offset for a given quiescent D.C. input operating level. The transfer ratio of this circuit and its output resistance are approximately the same as the PACF circuit disclosed in the copending application of James Ross Macdonald, Serial Number 464,335, filed October 25, 1954.

For the circuit in Figure 2 the input-output transfer ratio, G, may be expressed as:

$$G=\frac{\mu_3 g_1}{\mu_3+\mu_3'+\gamma p_3/R_{21}} \qquad (2)$$

and the output resistance, $\gamma_0$, may be expressed as $$\gamma_0=\frac{\gamma p_3}{\mu_3 g_2+\mu_3^1+\gamma p_3/R_{21}} \qquad (3)$$

The amplification term $g_1$ is the ratio of the signal at the plate of triode $V_2$ to the input signal and amplification $g_2$ is the ratio of the signal at the plate of triode $V_2$ to the output signal. The $\mu$'s and $\gamma p$'s are respectively the amplification factors and plate resistances of the triodes with the corresponding subscripts and the R's are the resistances of the resistors with the corresponding reference numerals. The term $\mu'$ is used to represent the quantity $\mu+1$. The formulas for $g_1$ and $g_2$ are as follows:

$$g_1=\left[\frac{\mu_1}{\mu_1^1+\gamma p_1/R_{14}}\right]\left[\frac{\mu_2^1}{1+\gamma p_2/R_{16}+(\mu_2^1\gamma p_1/R_{16})/(\mu_1^1+\gamma p_1/R_{14})}\right] \qquad (4)$$

$$g_2=\frac{\mu_2}{1+\gamma p_2/R_{16}+(\mu_2^1\gamma p_1/R_{16})/(\mu_1^1+\gamma p_1/R_{14})} \qquad (5)$$

In the above equation the loading on $V_2$ and $V_3$ is neglected which is usually a good approximation.

Figure 3:
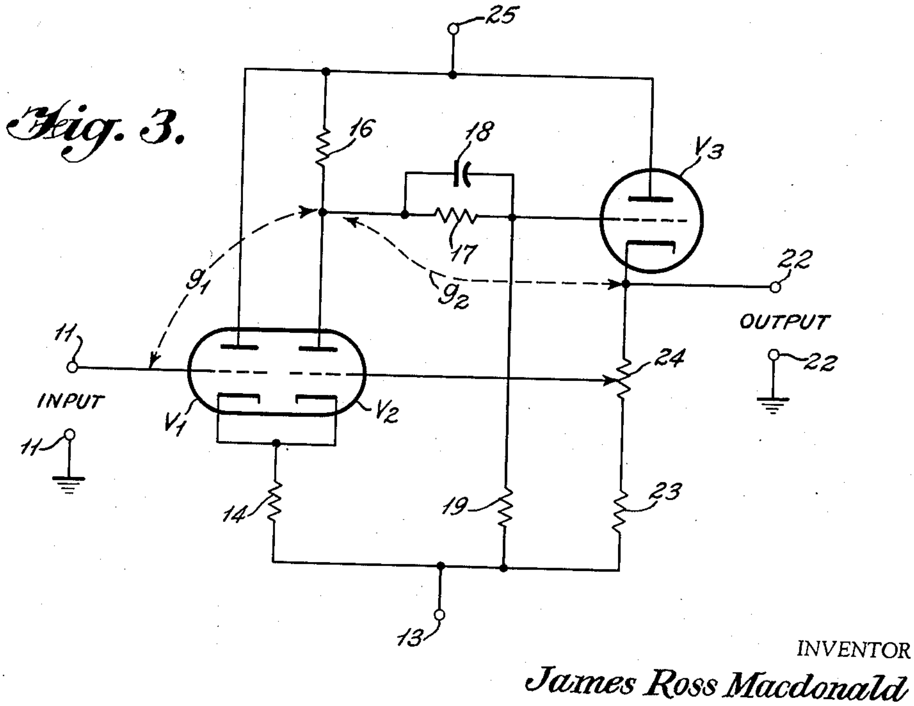

The circuit shown in Figure 2 has a transfer ratio of slightly less than unity. It may be easily modified however to have a transfer ratio of exactly unity or a greater amplification almost as large as the amplification term $g_1$. Such modified circuit is shown in Figure 3. The plates of the tubes $V_1$ and $V_3$ are still connected to a +250 volts which is applied to the terminal 25 but the plate of the tube $V_2$ is also connected to this source of 250 volts over the resistor 16. The cathode of the tube $V_3$ is connected to the terminal 13 through a tapped resistor 24 and resistor 23 and the terminal 13 has —105 volts applied thereto. The main distinction between the circuit shown in Figure 3 and that of Figure 2 is the fact that the grid for the tube $V_2$ is not directly connected to the output terminal but is connected to the tap of resistor 24. By adjusting the tap of this resistor, input-output transfer ratios, G, of unity and greater may be obtained as the negative feedback applied to the grid of the tube $V_2$ may be by such adjustment decreased. The resulting negative feedback reduction is equivalent to a decrease in $g_2$ while $g_1$ remains constant. As the Equations 2 and 3 show, a decrease in $g_2$ will result in an increase of both the transfer ratio G and the output resistance $\gamma_0$. A useful feature of the circuit is that G's of the order of 1 to 10 are still achieved with low output impedance and with no phase inversion. This feature makes this circuit well suited for the active element in RC filters. It should be noted however, that when the connection to the grid of the tube $V_2$ is tapped very far down the resistor 24, the voltage divider between the plate of the tube $V_2$ and the grid of the tube $V_3$ may have to be adjusted, and the quiescent D.C. output level begins to exceed that of the input appreciably. This result is often of no consequence; and it need not exist of course with A.C. coupling between $V_2$ and $V_3$.

The circuit of Figure 3 was designed specifically for an active filter where it is important that the transfer ratio be essentially independent of supply voltages, that amplification slightly greater than unity be achieved, and the output impedance be low. The transfer ratio of the circuit will vary less than 0.1% when the D.C. supply voltages vary by 10%.

The circuits of the Figures 2 and 3 may be considerably improved and the present invention is directed to the improvements thereof. Although the dynamic range of the circuits of Figures 2 and 3 is relatively large, it is limited by the quiescent voltage which may be applied to the tubes without exceeding their ratings and by the magnitude of the negative supply voltage. In addition, the main feedback loop is not effective in reducing non-linear distortion generated in the input cathode follower $V_1$, although being a cathode follower, its internal feedback helps keep such distortion low. Nevertheless, no matter how much the main loop feedback may reduce the distortion in the rest of the circuit, the final limiting distortion will be that of the tube $V_1$. The circuit shown in Figure 4 improves on the circuits of Figures 2 and 3 in that it further reduces the distortion and further increases the dynamic range of the circuit.

The input signal is applied to the terminals 11, one of which is connected to ground and the other of which is connected to the grid of the triode $V_1$. The plate of a triode $V_5$ is connected to the cathode of the tube $V_1$ and the cathode of the triode $V_5$ is connected over resistor 26 to a —400 volt source applied to terminal 13. The grid of the tube $V_5$ is connected to ground through a resistor 28 in parallel with a capacitor 29 and is also connected to the negative source on terminal 13 through a resistor 27. With the tube $V_5$ connected in this manner, it will act as a constant current impedance and replaces the resistor 14 of the circuits 2 and 3. The replacing of resistor 14 with a constant current impedance has the effect of greatly increasing the effective cathode resistance of the tube $V_1$ and improving the dynamic range of the tube $V_1$ particularly for large negative signals. The cathode of the tube $V_1$ is connected to the cathode of the tube $V_2$ and the signal which is applied at the terminals 11 will be transferred with reduced output impedance to the cathode of the tube $V_1$ and from there to the cathode of the tube $V_2$. The plate of the tube $V_2$ is connected to the positive source of voltage applied to the terminal 25 of 450 volts over resistor 16 and a variable resistor 32. The variable resistor may be adjusted to be a finite value or to zero ohms. The triode $V_2$ will amplify the difference between the signal on its cathode and the signal on its grid. The resulting signal on the plate of the tube $V_2$ will be the signal on the cathode of tube $V_2$ plus the amplified difference of the signal on the cathode and the signal on the grid. The parallel circuit of a capacitor 18 and reverse connected diodes 30 and 31 are connected from between resistors 32 and 16 to the grid of a triode $V_3$. A resistor 19 is connected from the grid of the tube $V_3$ to the negative supply applied to terminal 13. Diodes 30 and 31 are connected in series and are biased in the reverse direction to operate in their breakdown region and have a D.C. voltage drop nearly independent of current. At this point, it should be recognized that the use of diodes is preferable although standard components such as resistors could be used in place thereof. The diodes are biased over resistors 16 and 19 by the positive source connected to terminal 25 and the negative source connected to terminal 13. The capacitor 18, the diodes 30 and 31, and the resistor 19 operate to transfer the signal generated at the plate of triode $V_2$ to the grid of triode $V_3$. The plates of both of the tubes $V_1$ and $V_3$ are connected to the positive D.C. source at terminal 25 through a triode $V_4$ the grid of which is connected to the plate of triode $V_2$. The plate of triode $V_4$ is connected directly to the positive D.C. source at terminal 25. The triode $V_4$ thus operates as a cathode follower to drive the plates of the triodes $V_1$ and $V_3$ in accordance with the signal on the plate of the tube $V_2$. The cathode of the tube $V_3$ is connected over resistors 24 and 23 in series to the negative source applied to terminal 13. The cathode of the tube $V_3$ is also connected to one of the output terminals 22, the other of which is connected to ground. The resistor 24 has an adjustable tap which is connected to the grid of the tube $V_2$. This connection constitutes a negative feedback to the triode $V_2$. The tap on resistor 24 can be adjusted so that the grid of the tube $V_2$ is directly connected to output terminal or can be moved down the resistor to decrease the amount of negative feedback signal. The cathode of the output tube $V_3$ also is connected to the shielding on the input lead from one of the input terminals 11 to the grid of the triode $V_1$ so that the shielding is driven with the output signal.

The signal obtained from the plate of the tube $V_2$ will be the sum of the signal on the cathode of the tube $V_2$ and the amplified difference between the signal on the cathode of tube $V_3$ and the signal on the top of the resistor 24. This signal at the plate is used to drive the grid of the tube $V_3$ over the parallel circuit of the capacitor 18 and the diodes 30 and 31. The tube $V_3$ operates as a cathode follower and transfers the signal with reduced output impedance to its cathode and to the output terminal 22. The signal from the plate of the tube $V_2$ also drives the grid of the tube $V_4$ which acts as a cathode follower and drives with its cathode the plates of the tubes $V_1$ and $V_3$. This signal driving the plates of the tubes $V_1$ and $V_3$ is very nearly equal to the input signal and the plate voltage of triodes $V_1$ and $V_3$ will follow the input signal. For example, when the signal level at the input is increased by 100 volts, the plate and the cathode of tube $V_1$ both rise by nearly the same amount as does the grid, cathode and plate of both $V_2$ and $V_3$. It is therefore evident that as long as none of the tubes are saturated or cut off, the effective dynamic operating point of $V_1$, $V_2$ and $V_3$ wil be virtually independent of signal. Such independence means that these tubes cannot generate appreciable distortion. In fact, the tubes $V_1$, $V_2$ and $V_3$ all operate substantially on the same point in their characteristic and accordingly the output from these tubes is extremely linear. Since the signal path is through $V_1$, $V_2$ and $V_3$ from the input to the output, the output will be a virtually undistorted replica of the input. Furthermore, it is clear that although all D.C. levels can be arranged so that no quiescent plate voltage exceeds 300 volts, the instantaneous plate voltage of $V_1$, $V_2$ and $V_3$ can increase with a positive input signal until the tube $V_5$ is saturated. This behavior allows a very wide undistorted dynamic range to be obtained without exceeding tube ratings. The connection of the shielding of the input lead to the cathode of the output tube causes the shielding to also follow the input signal. The effect of this action is the virtual cancellation of all input capacitances. This cancellation of the input capacitance is most effective when the circuit is adjusted to have an input-output transfer ratio of unity. The two diodes 30 and 31 enable the full amount of feedback to be extended down to zero frequency. These diodes are silicon diodes and have very low A.C. or differential resistance but a D.C. drop nearly independent of current. Each diode is selected to have a drop of 100 volts so that the total drop across the two series-connected diodes is 200 volts. Instead of using two diodes, one may be used so that the total drop is 100 volts. When the triode $V_2$ is directly connected to the cathode of the triode $V_3$, the input-output transfer ratio will be slightly less than unity. By moving the tap down the resistor 24 the negative feedback is reduced and the transfer ratio is increased in the same manner as was described with reference to the resistor 24 in the circuit of Figure 3. By the proper adjustment of this tap the transfer ratio may be made unity or greater.

Figure 4:
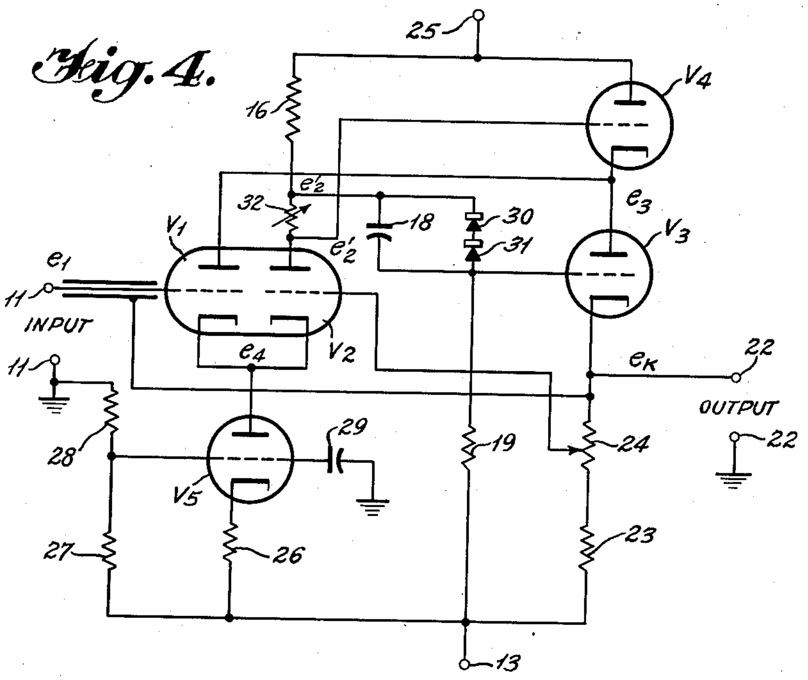
Figure 4 shows the circuit of Figures 2 and 3 as modified by the invention.

To facilitate the description of the circuit in Figure 4 the following symbols are used:

$e_1$ =input signal voltage which is the signal voltage applied to the grid of the triode $V_1$.
$e'_2$=the signal voltage at the plate of the triode $V_2$.
$e_2$=the signal voltage at the junction between resistors 16 and 32.
$e_3$ =the signal voltage at the cathode of the triode $V_4$ and at the plates of the triodes $V_1$ and $V_3$.
$e_4$ =the signal voltage at the cathodes of triodes $V_1$ and $V_2$.
$e_k$=the output signal voltage or the voltage at the cathode of the triode $V_3$.
G=the input-output transfer ratio $e_k/e_1$.
The transfer ratio $g_2=e_2/e_1$.
The transfer ratio $g'_2=e'_2/e_1$.
The transfer ratio $g_3=e_3/e_1$.
The transfer ratio $g_4=e_4/e_1$.

The $\mu$'s, $g_m$'s and the $\gamma p$'s are respectively the amplification factors, the transconductances and plate resistances of the tubes with the corresponding subscripts.

The R's are the resistances of the resistors with reference numerals corresponding to the subscripts.

$$\mu'=\mu+1$$

Below will be given the results of an approximate analysis of the mid-frequency equivalent circuit with the resistor 32 adjusted to be zero ohms and the tap of the resistor 24 adjusted so that the grid of the triode $V_2$ is connected directly to the cathode of the triode $V_3$. This analysis shows that $e_2$, $e_3$, and $e_4$, and $e_k$ will all follow $e_1$ closely. These results can be described in words as follows, however. The input signal to $V_3$ will be essentially $e_2$ since no appreciable loss of signal occurs across the diode-capacitor combination. Further $e_3$ will be nearly equal to $e_2$ since $V_4$ is a cathode follower. Thus, $e_k$ will also be nearly equal to $e_2$. Since $e_k$ and $e_3$ are both equal to or almost equal to $e_1$, $e_4$ will also almost equal $e_1$. Finally, the negative feedback between $V_3$ and $V_2$ will act in such sense that $e_2$, which equals $e_4$ plus the amplified difference between $e_4$ and $e_k$ will, in turn, be nearly equal to $e_1$. Because of the cathode follower action of $V_3$, $e_k$ must be smaller than $e_2$; $e_2$ will thus be slightly greater than $e_4$ and may even exceed $e_1$. Note that driving the plate of $V_3$ with the signal $e_3$, which is almost as large as $e_2$, makes $e_k$ closer to $e_2$ than would be the case if the plate of $V_3$ were not so driven. If there were no loss between $e_2$ and $e_k$, it is easy to show that then $e_2$ and $e_k$ would also equal $e_4$.

Although algebraic expressions for the various transfer ratios which may be defined for Figure 4 have been worked out taking into account the loading of $V_3$ and $V_4$ on $V_2$ and that of $V_1$ on $V_4$, the results are exceptionally complicated and will not be given. Even when such loading is neglected, algebraic expression for the transfer ratios are still long. We shall give those for $g_2$ and G because of the light they throw on the distortion of the circuit. The main error occasioned by neglecting loading comes from omitting the effect of the plate current of $V_1$ on the cathode current of $V_4$. Since the former will generally be at least ten times smaller than the latter for the circuit of Figure 4, the error resulting from its neglect will be small.

We have the following approximate results:

$$g_2=\frac{\mu_1\mu_2^1}{\mu_1^1\mu_2M-\mu_2^1N+\mu_1^1\left(1+\frac{\gamma p_2}{R_{16}}\right)+\mu_2\left(M\frac{\gamma p_1}{R_x}+\frac{\gamma p_1}{R_{16}}\right)+\frac{\gamma p_1}{R_{16}}\left(1+\frac{R_{16}}{R_x}+\frac{\gamma p_2}{R_x}\right)} \quad (6)$$

$$G=Mg_2, \quad (7)$$

where:

$$M=\frac{\mu_3^1\mu_4+\mu_3}{\mu_3^1\mu_4^1+\mu_4^1\gamma p_3(R_y+\gamma p_4)R_y}$$

$$N=\frac{\mu_3^1\mu_4+\mu_4\gamma p_3/R_y-\mu_3\gamma p_4/R_y}{\mu_3^1\mu_4^1+\mu_4^1\gamma p_3/R_y+\gamma p_4/R_y}$$

For simplicity, we have written the sum, $R_{23}+R_{24}$, as $R_y$ and the effective resistance of the constant current tube, $r_{p5}+(\mu 5+1)R_{k5}$ as $R_x$. For the circuit of Figure 4, $R_x$ is of the order of 2 megohms. The quantities M and N are less than unity. Equation 6 shows that $g_2$ may exceed unity; even so, G will be slightly less than unity. Note that the parameters of $V_4$ enter the expression for G only through $M$ and $N$. Further, for Figure 4, these quantities may be approximated quite closely by $$M\simeq\left[\frac{\mu_3}{\mu_3+\gamma p_3/R_y}\right]\left[\frac{1+2/\mu_4}{1+1/\mu_4}\right]\cong\left(\frac{\mu_3}{1+\mu_3}\right)\left(1+\frac{1}{\mu_4}\right) \quad (8)$$

and:

$$N\simeq[\{1+\gamma p_3/(\mu_3^1R_y)\}\{1+1/\mu_4\}]^{-1}\cong\left(1-\frac{1}{\mu_4}\right) \quad (9)$$

Thus, to a good approximation only $\mu^4$ enters M and N and then only as a second order term. Since $\mu$ for a tube is relatively independent of operating point, the effect of the parameters of $V_4$ on G is therefore exceedingly small and their changes arising from wide excursions of the input signal $e_1$ will have a negligible effect on G. We may also note that Equations 6 to 9 indicate that increasing the $\mu$'s and $g_m$'s of the various tubes will make G closer to unity.

The transfer ratio G may be made unity or greater by moving the tap of the resistor 24 down to reduce the negative feedback in the manner described with reference to Figure 3.

Some of the other transfer ratios of the circuit may alternatively be made unity by adjusting the resistor 32 to have the proper finite value. The table shows some experimental results for various transfer ratios measured on a circuit such as is shown in Figures 4 with $e_1$=10 volts R.M.S. at $10^3$ c.p.s.

*Table*

| $R_{32}$ | $1-g_4$ | $1-g_3$ | $g'_2-1$ | $1-g_2$ | $1-G$ |
|---|---|---|---|---|---|
| 0 | 0.0025 | 0.059 | 0.0039 | −0.0039 | 0.0050 |
| 21K | 0.00178 | ~0 | 0.066 | 0.00068 | 0.0050 |
| 82K | ~0 | −0.182 | 0.260 | 0.0118 | 0.0050 |

The first row for $R_{32}=0$ shows that $g_4=e_4/e_1=0.9975$, $G=0.995$, and that $g_2$ is slightly greater than unity. These ratios are nearly independent of signal magnitude over a wide range. They show that a 100-volt increase in the grid voltage $e_1$ of $V_1$ would lead to a 99.75-volt cathode rise and a 94.1-volt plate rise; as far as $V_1$ is concerned the 100-volt input signal looks, therefore, like a 0.25-volt grid bias decrease and a cathode-to-plate voltage decrease of only 5.6 volts.

The table shows that increasing $R_{32}$ from zero to 21K causes $g_3$ to become unity, while an $R_{32}$ of 82K makes $g_4$ unity while causing $g'_2$ and $g_3$ to be appreciably greater than unity. The places in the table marked ~0 are not shown as exactly zero because they were limited to a minimum non-zero value by the exceedingly small non-linear harmonic distortion components present in the output signal as compared to the input $e_1$, even when $R_{32}$ was adjusted to make their fundamentals exactly equal.

Because of the feedback present in the circuit of Figure 4, loading the output tends to increase $g_2$ to compensate for such loading.

We have already mentioned how input capacitance at the input of the circuit in Figure 4 is cancelled. For many applications it is desirable to have exceedingly high input resistance as well. When the grid of tube $V_1$ of Figure 4 is left floating completely free, the output level is found to be −65 volts. This value is determined by the grid-cathode bias of $V_1$ at which positive and negative grid currents cancel. Since the output follows the input, we may infer that the input grid also floats at a level of about −65 volts. For infinitesimal input signals applied around −65 volts which do not appreciably alter the grid-cathode bias of $V_1$, the input resistance is essentially infinite since the grid current is zero. However, in the present circuit, one must remember that the cathode potential of $V_1$ follows its grid potential very closely; hence, we may expect that appreciable input signals may be applied before the $V_1$ grid-cathode bias changes enough to lower the input resistance greatly.

For the circuit of Figure 4 it is found that the input resistance will equal approximately $2\times10^9$ ohms when +100 volts is applied to the input and $4\times10^{10}$ ohms for −100 volts. For the measurement of D.C. potentials and charges from a very high impedance source, it is desirable that the input grid float at or nearly at zero potential when left free. By adjusting resistor 26 we can readily change the floating point from −65 volts to 0 volts. With this adjustment, when $E_{in}$ is +100 or −100 volts, the input resistance will be $1.6\times10^{10}$ and $7\times10^{10}$ ohms respectively. The results for smaller input swings are the same or higher. Comparable results are obtained when a single 100-volt-drop diode is used instead of the two of Figure 4.

Although an input resistance of $10^{10}$ ohms or greater is high enough for many applications, even higher values can be obtained in the following manner. The maintenance of an extremely high input impedance over a wide input voltage range depends, as we have noted, on the grid-cathode bias of $V_1$ remaining at or nearly at its grid-current cancellation value independent of the actual input level. By making $g_4$ equal unity by means of the series plate resistor 32, the A.C. and differential D.C. voltage transfer ratio from input to the cathode of triode $V_1$ becomes unity and changes of input level should have no effect whatsoever on the grid-cathode potential of $V_1$. Such operation will, therefore, give increased input impedance over a wide range. To make this adjustment it is necessary to set resistor 32 to some value greater than zero, then adjust resistor 26 to make the output potential zero with the input grid floating. The floating point is a fairly sensitive function of triode $V_1$ heater current under these conditions, and it is desirable therefore to regulate the heater voltage for the entire circuit to render the output potential more stable with respect to time with the input floating.

With the resistors 32 and 26 properly adjusted, the input resistance can be made to be $5\times10^{11}$ ohms for swings of both −100 and +100 volts. The above results are obtained without increasing resistor 32 sufficiently to make $g_4=1$ but causing it to be closer to unity than without resistor 32. The floating point is quite stable under these conditions. It is possible to further increase resistor 32 to obtain an input resistance of about $10^{12}$ ohms with fair stability of the floating point. However, when resistor 32 is further increased to make $g_4=1$, the floating point is quite unstable.

These results indicate that an input-output resistance transfer ratio exceeding $10^{11}$ is obtainable with the circuit of Figure 4. Since it responds linearly over a wide input signal range, the circuit would be very well suited for the input stages of a wide-range, extremely high input resistance A.C.-D.C. vacuum tube voltmeter. Using input capacitance cancellation, its effective input capacitance could also be held to a fraction of a micro-microfarad over a relatively wide frequency range.

Figure 7:
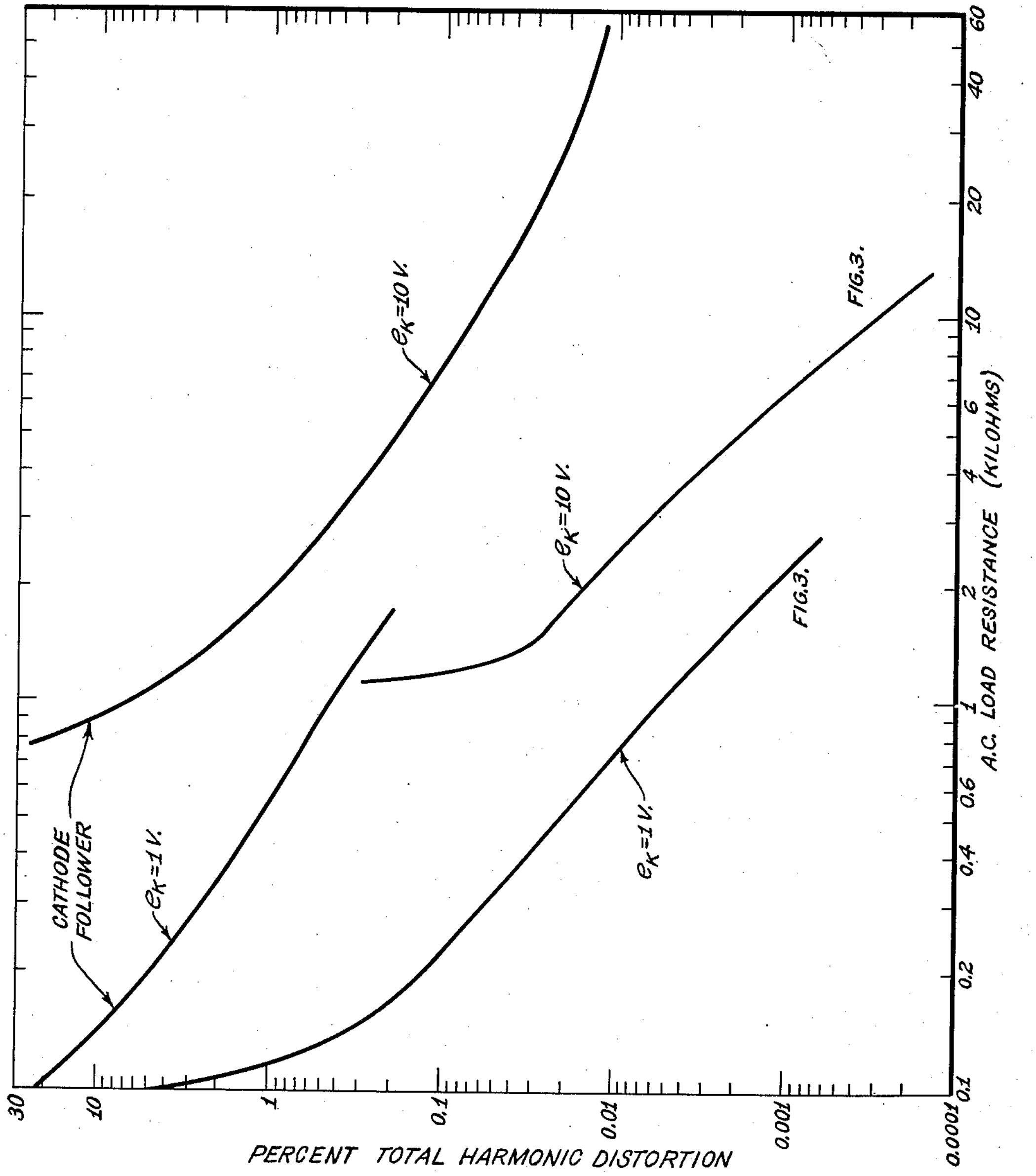
Figure 8:
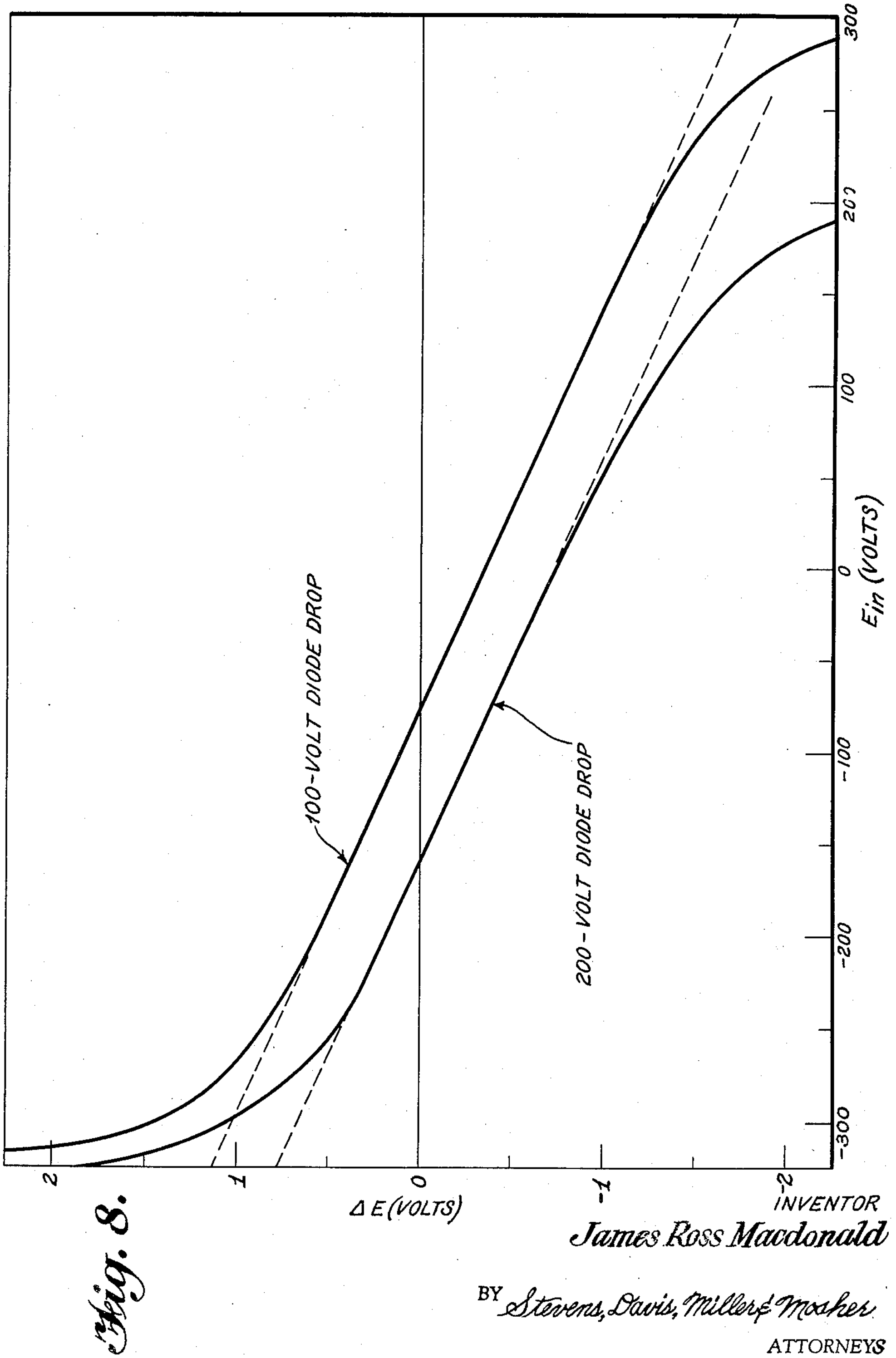

Figures 6, 7 and 8 are curves illustrating the superior results obtained from the circuit of Figure 4. In these curves the resistance 32 is adjusted to be zero ohms and the tap of the resistor 24 is adjusted to connect the cathode of the triode $V_3$ directly to the grid of the triode $V_2$.

Figure 8 shows curves of the D.C. linearity of the circuit of Figure 4 with either two diodes in the voltage divider chain as shown in Figure 4 or with only one such diode. Here we plot $\Delta E=E_{in}-E_K$ versus $E_{in}$, where the capital letters denote D.C. voltages. The non-zero slopes of the central portions of these curves arise from the deviation of G from unity. For these regions, the device is so linear that deviations from linearity (deviations of the solid line curves from the dotted line) do not show up visually even on this magnified scale. The deviations from linearity at the ends of the curves arise from the onset of positive or negative clipping. Even the extreme deviations shown at the ends of the curves represent only about one percent departure from linearity. Note that with one diode, $E_K=E_{in}$ for $E_{in}=-75$ volts, while for both diodes, this point is reached at $E_{in}=-155$ volts. This point may be varied and brought to $E_{in}=0$ if desired by changes in the values of the resistor 26 and/or the resistor 16. Under these conditions, there would be no D.C. offset at $E_{in}=0$ and offset at any other value of $E_{in}$ would be produced just by the slight departure of G from unity.

The exceptional linearity and the extremely low distortion of the circuit of Figure 4 is further demonstrated by Figures 6 and 7 which illustrate the comparison of distortion in an ordinary cathode follower and distortion in the circuit of Figure 4. Figure 6 shows how the total harmonic distortion of an ordinary cathode follower and of the circuit of Figure 4 depend on output signal with no added load. The curve 40 depicts the distortion obtained from an ordinary cathode follower. The curves 41 and 42 show the distortion obtained from the circuit of Figure 3 with grid biases of 0 and −90 volts respectively. To obtain the curve 43 the grid bias was progressively adjusted from +30 to +90 volts to place the quiescent operating point at the position on the dynamic transfer characteristic that gives symmetrical operation. Note that the total harmonic distortion is less than one part in a million at 20 volts output and only 2 parts in a hundred thousand at 100 volts output. Figure 7 shows the dependence of the distortion of the circuit of Figure 4 and of an ordinary cathode follower on total loading for different fixed signal magnitudes. The rapid rise of the curves around loads of 1K and 100 ohms comes from the approach of negative peak clipping. It will be noted that in both Figures 6 and 7 that the circuit of Figure 4 has the order of a hundred times less distortion than the simple cathode follower.

Figure 5:
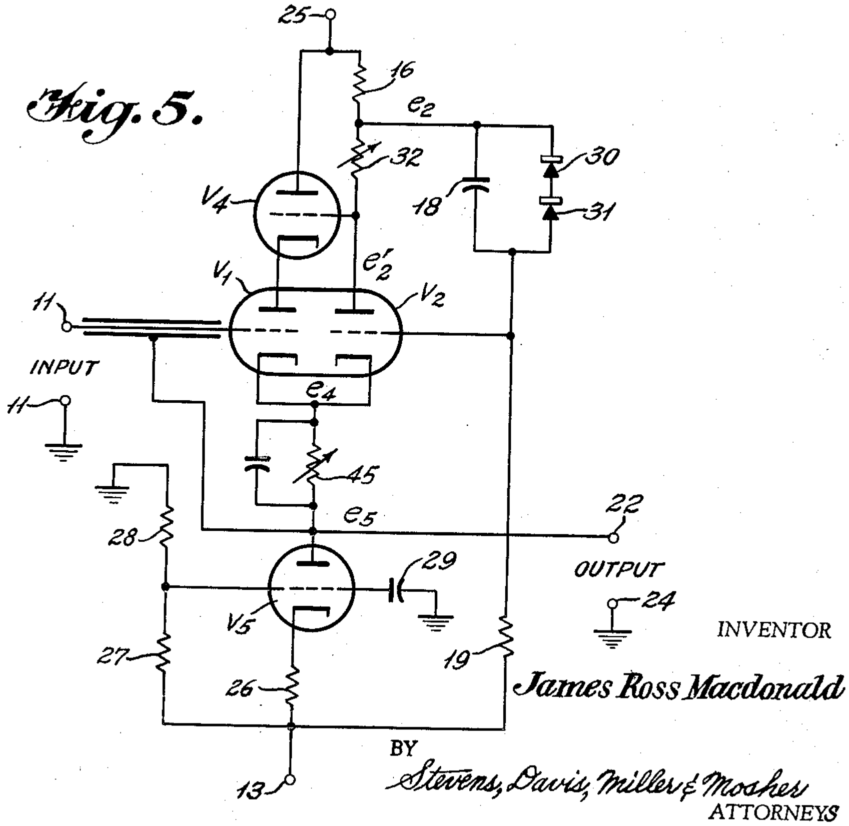
Figure 5 shows the detailed circuitry of another modification of the invention.

In Figure 5 there is shown a simplified circuit which uses only four triodes. This circuit has an output impedance of several hundred ohms, appreciably higher than that of the other augmented cathode followers. Its main advantages are that its A.C. and D.C. input-output transfer ratio can be made exactly unity (with the resulting exceedingly high input resistance already discussed in connection with Figure 4), and it can have essentially zero D.C. offset over a wide range. It is thus an impedance converter from very high input impedance to moderately low output impedance with unity transfer ratio and wide frequency response extending from D.C. to tens of megacycles with driven shielding.

This circuit is a simplification of the circuit shown in Figure 4 and operates in much the same manner. The output tube $V_3$ has been eliminated and the negative feedback to the grid of the tube $V_2$ is connected from the junction of the resistor 19 and the parallel circuit of the diodes 30 and 31 and the capacitor 18. The output is taken from the plate of the diode $V_5$ and a variable resistor 45 connects this point of the circuit to the cathodes of the triodes $V_1$ and $V_2$. This circuit point is also connected to the shielding on the input lead to the grid of triode $V_1$ to eliminate input capacitance in a manner which has been described. The triode $V_4$ drives the plate of the triode $V_1$ to cause it to move up and down with the input signal in the manner described with reference to Figure 4. Likewise, the triode $V_5$ provides a constant current impedance in the cathode circuit of the triode $V_1$ as was done in the circuit of Figure 4.

By adjusting the series resistor 32, $e_2'$, the signal voltage on the plate of triode $V_2$, may be increased to a value which makes the transfer ratio $g_4=e_4/e_1$ or $g_5=e_5/e_1$ exactly unity where $e_4$ is the signal voltage on the cathode of the triode $V_1$ and $e_5$ is the signal voltage on the plate of the triode $V_5$ at the output. The resistor 45 is then adjusted to make the D.C. drop across it exactly equal to the grid-cathode bias of triode $V_1$. Then the D.C. output will also be exactly equal to the input. Since triode $V_5$ is a constant-current tube having very high differential resistance, the D.C. current through resistor 45 will be held nearly constant and independent of the input signal magnitude or level. Further, since the transfer ratio $g_4$ is unity for differential changes, the grid-cathode bias of triode $V_1$ is also virtually independent of signal level; thus, the D.C. offset itself remains zero, independent of level over a wide range. It will be noted that resistor 32 cannot be adjusted to make both $g_4$ and $g_5$ simultaneously unity because of the A.C. drop across resistor 45. Since this resistance is so much smaller than the differential resistance of triode $V_5$, this drop will be exceedingly small, however, and can be even further reduced if necessary by means of the large capacitor shunting the resistor 45.

For most applications, it will be best to make $g_5=1$ and rely on the fact that $g_4$ will then be exceedingly close to unity so that the grid-cathode bias of $V_1$ will still remain nearly constant keeping the D.C. offset very nearly independent of level. Note that when D.C. offset is of no consequence, resistor 45 may be omitted. Finally, it is worth mentioning that for both Figures 4 and 5 the resistances 16, 32 and 26 can all be adjusted to values which will make the output level zero whether the input grid is floating or grounded. Under these conditions, this grid will float at ground potential, there will be no input-output D.C. offset, and the zero offset will be independent of source resistance.

The above invention has been described as applicable to vacuum tube circuits. Most of the inventive features are also applicable to transistor circuits and other circuits using the equivalent of a transistor or vacuum tube. Accordingly, the term active circuit element as used in the claims is defined as a vacuum tube, transistor, or their equivalents.

The above disclosure shows specific embodiments of the present invention and numerous modifications can be made to the disclosure without departing from the spirit and scope of the invention which is to be limited only as defined in the appended claims.

What is claimed is:

1. A circuit comprising a vacuum tube having a grid, cathode, and plate, an impedance having a first terminal and a second terminal, circuit means connecting said first terminal of said impedance to said cathode, means to apply a D.C. potential between said plate and the second terminal of said impedance, means to apply a signal to said grid, a high gain amplifier, a negative feedback circuit feeding the output of said amplifier back to the input of said amplifier to reduce the over-all gain of said amplifier to slightly greater than unity, circuit means connecting said amplifier to amplify a signal generated at the cathode of said vacuum tube, and circuit means to drive the plate of said vacuum tube with the output signal of said amplifier substantially unchanged in amplitude and in phase with the signal generated at said cathode.

2. A circuit as recited in claim 1 wherein said impedance is a constant current impedance.

3. A circuit as recited in claim 1 wherein said means for applying a signal to the grid of said vacuum tube comprises a conductor having shielding and means are provided to drive said shielding with a signal derived from said input signal.

4. A circuit comprising a first amplifier having an anode, a cathode, and a control electrode, a first impedance connected to the cathode of said first amplifier forming a series circuit with said first amplifier, a second amplifier having an anode, a cathode, and a control electrode and having its cathode connected to the cathode of said first amplifier, a second impedance connected to the anode of said second amplifier forming a series circuit with said second amplifier and said first impedance, a third amplifier having an anode, a cathode and a control electrode and having its cathode connected to the anode of said first amplifier to form a series circuit with said first amplifier and said first impedance, means to provide D.C. current flow through the series circuit of said third amplifier, said first amplifier and said first impedance and through the series circuit of said second impedance, said second amplifier and said first impedance, means to apply an input signal to the control electrode of said first amplifier, means to apply a signal derived from the anode of said second amplifier to the control electrode of said third amplifier, and means to apply a negative feedback signal derived from the anode of said second amplifier to the control electrode of said second amplifier.

5. A circuit as recited in claim 4 wherein said first impedance is a constant current impedance.

6. A circuit comprising a thermionic emission device having a grid, cathode, and plate, connected as a cathode follower, means to apply an input signal to said grid, a high gain amplifier, a negative feedback circuit feeding the output of said amplifier to the input of said amplifier to reduce the over-all gain of said amplifier to slightly greater than unity, circuit means connecting said amplifier to amplify the output signal of said cathode follower, and circuit means to drive said plate with the output signal of said amplifier substantially unchanged in amplitude and in phase with the output signal from said cathode follower.

7. A circuit as recited in claim 6 wherein said means for applying a signal to the grid input of said cathode follower comprises a conductor having shielding and means are provided to drive said shielding with a signal derived from said input signal.

8. A circuit comprising an active circuit element having a first terminal and a second terminal and a conductance therebetween continuously variable in accordance with an input signal, an impedance having a first terminal and a second terminal, means connecting the first terminal of said impedance to the second terminal of said active circuit element, means for applying a D.C. potential between the first terminal of said active circuit element and the second terminal of said impedance, a high gain amplifier, a negative feedback circuit feeding the output of said amplifier to the input of said amplifier to reduce the over-all gain of said amplifier to slightly greater than unity, circuit means connecting said amplifier to amplify the signal generated at the second terminal of said active circuit element, and circuit means to drive the first terminal of said active circuit element with the output signal of said amplifier substantially unchanged in amplitude and in phase with the signal generated at the second terminal of said active circuit element.

9. A circuit as recited in claim 8 wherein said impedance is a constant current impedance.

10. A circuit comprising a first amplifier having an anode, a cathode, and a control electrode, a first impedance connected to the cathode of said first amplifier forming a series circuit with said first amplifier, a second amplifier having an anode, a cathode and a control electrode and having its cathode connected to the cathode of said first amplifier, a second impedance connected to the anode of said second amplifier forming a series circuit with said second amplifier and said first impedance, a third amplifier having an anode, a cathode and a control electrode, a third impedance connected to the cathode of said third amplifier forming a series circuit with said third amplifier, a fourth amplifier having an anode, a cathode and a control electrode and having its cathode connected to the anodes of said first and third amplifiers to form a series circuit with said first amplifier and said first impedance and to form a series circuit with said third amplifier and said third impedance, means to provide D.C. current flow through the series circuit of said fourth amplifier, said first amplifier, and said first impedance, through the series circuit of said fourth amplifier, said third amplifier, and said third impedance, and through the series circuit of said second impedance, said second amplifier and said first impedance, means to apply an input signal to the control electrode of said first amplifier, means to apply a signal derived from the anode of said second amplifier to the control electrode of said third amplifier, means to apply a signal derived from the anode of said second amplifier to the control electrode of said fourth amplifier, and means to apply a negative feedback signal derived from the cathode of said third amplifier to the control electrode of said second amplifier.

11. A circuit as recited in claim 10 wherein said first impedance is a constant current impedance.

References Cited in the file of this patent

UNITED STATES PATENTS

| | | |
|---|---|---|
| 2,538,488 | Volkers | Jan. 16, 1951 |
| 2,554,172 | Custin | May 22, 1951 |
| 2,672,529 | Villard | Mar. 16, 1954 |
| 2,737,547 | Deming | Mar. 6, 1956 |
| 2,743,325 | Kaiser et al. | Apr. 24, 1956 |
| 2,795,654 | MacDonald | June 11, 1957 |
| 2,796,468 | McDonald | June 18, 1957 |